US011866373B2

(12) United States Patent
Delehouze et al.

(10) Patent No.: US 11,866,373 B2
(45) Date of Patent: Jan. 9, 2024

(54) METHOD FOR COATING FIBERS IN A FLUIDIZED BED

(71) Applicants: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Arnaud Delehouze, Moissy-Cramayel (FR); Eric Bouillon, Moissy-Cramayel (FR); Amine El Mansouri, Bordeaux (FR); Nathalie Dominique Bertrand, Saint-Maixant (FR); Alain Jean-Michel Guette, Le Bouscat (FR)

(73) Assignees: CENTRE NATIONAL DE LA RECHERCHE SCIENTIFIQUE, Paris (FR); SAFRAN CERAMICS, Le Haillan (FR); UNIVERSITE DE BORDEAUX, Bordeaux (FR)

( * ) Notice: Subject to any disclaimer, the term of this patent is extended or adjusted under 35 U.S.C. 154(b) by 0 days.

(21) Appl. No.: 18/042,963

(22) PCT Filed: Aug. 25, 2021

(86) PCT No.: PCT/FR2021/051485
§ 371 (c)(1),
(2) Date: Feb. 24, 2023

(87) PCT Pub. No.: WO2022/049336
PCT Pub. Date: Mar. 10, 2022

(65) Prior Publication Data
US 2023/0227368 A1  Jul. 20, 2023

(30) Foreign Application Priority Data
Sep. 1, 2020 (FR) .................................... 2008867

(51) Int. Cl.
*C04B 35/573* (2006.01)
*C04B 35/628* (2006.01)
(Continued)

(52) U.S. Cl.
CPC .. *C04B 35/62884* (2013.01); *C04B 35/62868* (2013.01); *C04B 35/62871* (2013.01);
(Continued)

(58) Field of Classification Search
CPC ........ C04B 35/62884; C04B 35/62873; C04B 35/80; C23C 16/26; C23C 16/342; C23C 16/345
See application file for complete search history.

(56) References Cited

U.S. PATENT DOCUMENTS 4,220,600 A * 9/1980 Yajima .................. C08G 77/32
556/434
5,015,528 A * 5/1991 Pinneo .................... C30B 29/04
501/86
(Continued)

FOREIGN PATENT DOCUMENTS

CN 110382444 A 10/2019
EP 0 258 027 A2 3/1988
(Continued)

OTHER PUBLICATIONS

International Search Report as issued in International Patent Application No. PCT/FR2021/051485, dated Jan. 4, 2022.
(Continued)

*Primary Examiner* — Joseph A Miller, Jr.
(74) *Attorney, Agent, or Firm* — Pillsbury Winthrop Shaw Pittman LLP

(57) ABSTRACT

A method for coating fibers, includes desizing sized short fibers having an average length less than or equal to 5 mm, the short fibers being made of ceramic material or carbon,
(Continued)

sieving the desized short fibers in order to separate them from any agglomerates of sized short fibers still present, introducing the desized and sieved short fibers into a reactor, and coating the short fibers in the reactor by chemical vapor deposition in a fluidized bed.

9 Claims, 2 Drawing Sheets

(51) Int. Cl.
      *C04B 35/657*     (2006.01)
      *C04B 35/80*     (2006.01)
      *C23C 16/04*     (2006.01)
      *C23C 16/26*     (2006.01)
      *C23C 16/34*     (2006.01)

(52) U.S. Cl.
    CPC .. *C04B 35/62873* (2013.01); *C04B 35/62878* (2013.01); *C04B 35/62897* (2013.01); *C04B 35/657* (2013.01); *C04B 35/80* (2013.01); *C23C 16/045* (2013.01); *C23C 16/26* (2013.01); *C23C 16/342* (2013.01); *C23C 16/345* (2013.01); *C04B 2235/428* (2013.01); *C04B 2235/526* (2013.01); *C04B 2235/5248* (2013.01); *C04B 2235/5252* (2013.01); *C04B 2235/5264* (2013.01); *C04B 2235/616* (2013.01)

(56) References Cited

U.S. PATENT DOCUMENTS

| | | | |
|---|---|---|---|
| 6,143,376 | A | 11/2000 | Linn et al. |
| 2001/0051258 | A1* | 12/2001 | Hanzawa ................ C04B 35/80 |
| | | | 428/294.1 |
| 2004/0150312 | A1* | 8/2004 | McElrath .............. C01B 32/168 |
| | | | 313/310 |
| 2014/0287317 | A1 | 9/2014 | Tiquet et al. |
| 2020/0370170 | A1 | 11/2020 | Tesson et al. |
| 2020/0377417 | A1 | 12/2020 | Delehouze et al. |

FOREIGN PATENT DOCUMENTS

| | | |
|---|---|---|
| EP | 0 967 190 A1 | 12/1999 |
| FR | 2 939 130 A1 | 6/2010 |
| FR | 2 981 643 A1 | 4/2013 |
| JP | S63-277563 A | 11/1988 |
| WO | WO 2019/122760 A1 | 6/2019 |

OTHER PUBLICATIONS

Written Opinion of the International Searching Authority as issued in International Patent Application No. PCT/FR2021/051485, dated Jan. 4, 2022.

Office Action as issued in Chinese Patent Application No. 202180053708.1, dated Aug. 28, 2023.

\* cited by examiner

[Fig. 1]
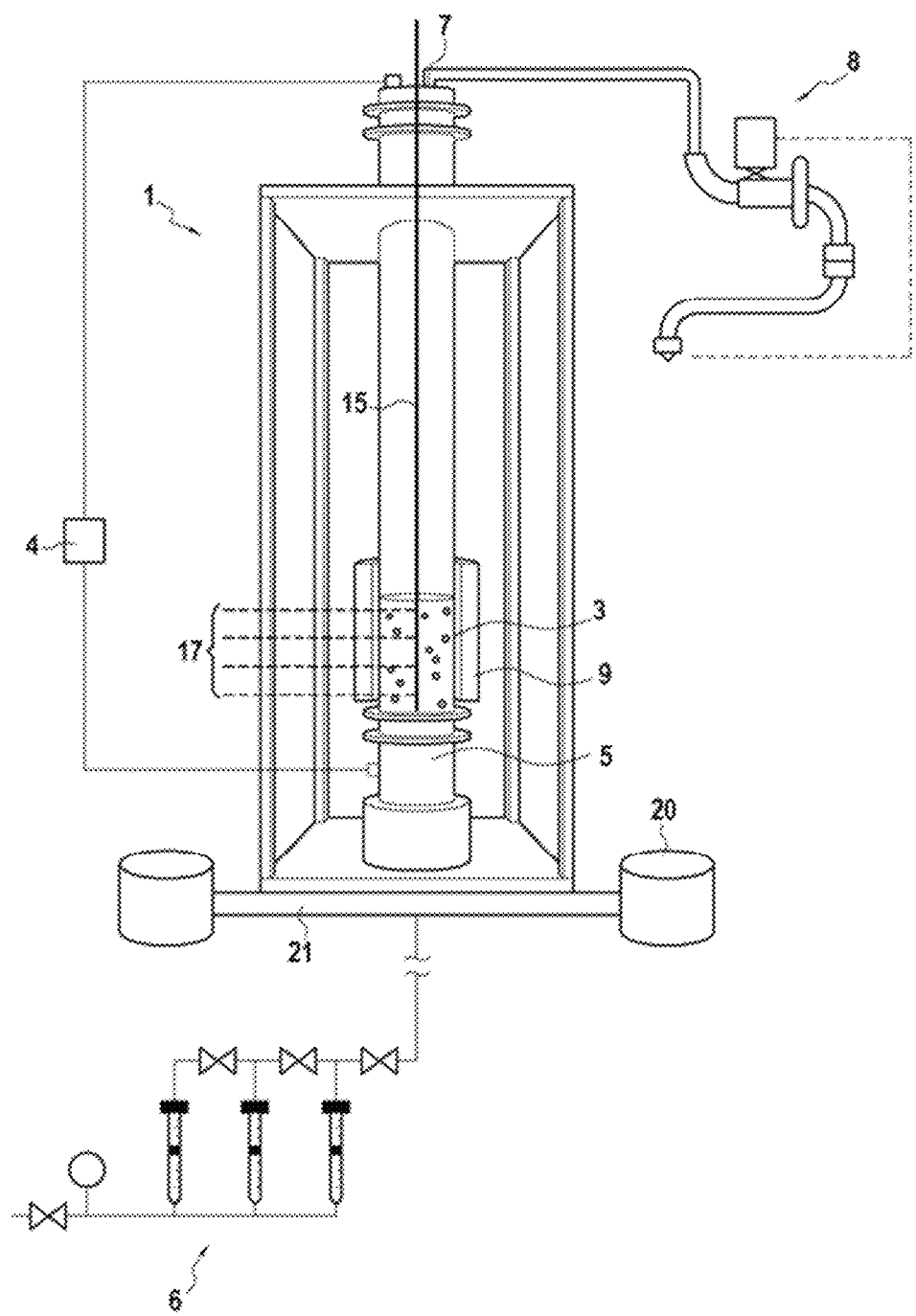

[Fig. 2]
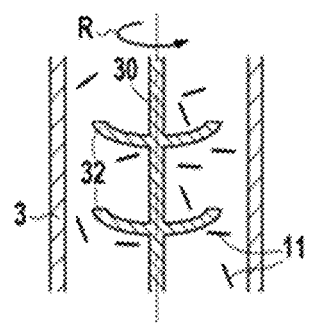
[Fig. 3]
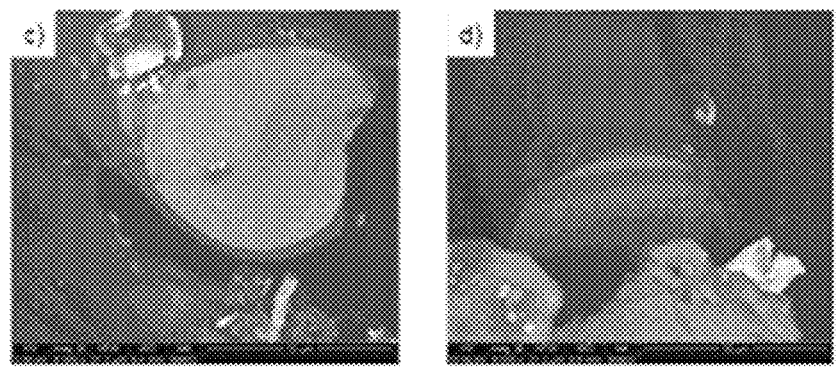

METHOD FOR COATING FIBERS IN A FLUIDIZED BED

CROSS-REFERENCE TO RELATED APPLICATIONS

This application is the U.S. National Stage of PCT/FR2021/051485, filed Aug. 25, 2021, which in turn claims priority to French patent application number 20 08867 filed Sep. 1, 2020. The content of these applications are incorporated herein by reference in their entireties.

TECHNICAL FIELD

The present invention relates to a method for coating short fibers by chemical vapor deposition in a fluidized bed.

PRIOR ART

Ceramic matrix composite materials (CMC materials) have good thermostructural properties, that is to say high mechanical properties which make them suitable for forming structural parts, and the ability to retain these properties at high temperatures. CMC parts can comprise a textile reinforcement made up of long and continuous fibers woven along the stress directions of the final composite part. The weaving step is an expensive step and the use of a woven fibrous reinforcement can have limitations in the case of parts with complex geometry or small size. Indeed, the minimum weaving pitch may prove to be too coarse for the production of a small geometric detail.

In order to overcome this problem, consideration has been given to using a reinforcement no longer consisting of continuous long fibers but of short fibers dispersed in the matrix. However, it is well known that the functioning of a CMC material requires specific management of the interfacial bonds between fibers and matrix, in order to access the damageable nature of the final composite. This modulation of the interfaces is obtained, conventionally by interposition of an interphase between the fiber and the matrix.

In addition to the interphase coating, it may prove desirable in some cases to protect the fibrous reinforcement with an additional refractory coating to protect the fibers against attacks resulting from the subsequent steps of forming the matrix.

In the case of woven fibrous reinforcements, the formation of the interphase and of the additional refractory coating can be carried out by chemical vapor infiltration. However, this deposition technique is not directly applicable for coating short fibers. Indeed, a pile of short fibers treated by the conventional technique of chemical vapor infiltration will lead to a partially consolidated agglomerate, resulting from fiber-to-fiber bonding, by the deposited coating, and therefore to fibers which are not individually coated. Another conceivable solution would be to coat continuous long fibers by scrolling through a chemical vapor deposition chamber then to cut these coated long fibers to the desired length to obtain coated short fibers.

However, the cutting step to obtain short fibers can lead to an inhomogeneous coating on the cut fibers, or even to damage to the latter. An inhomogeneous coating can lead to a chemical attack of the fibers by the molten silicon used to form the matrix by infiltration technique in the molten state and therefore to a degradation of the mechanical properties of the part.

It is therefore desirable to have a method allowing to limit, or even eliminate, the formation of aggregates during the coating of short fibers and to improve the homogeneity of the coating formed.

DISCLOSURE OF THE INVENTION

The present invention relates to a method for coating fibers, comprising at least:
 desizing, for example by heat treatment, sized short fibers having an average length less than or equal to 5 mm, the short fibers being made of ceramic material or carbon,
 sieving the desized short fibers in order to separate them from any agglomerates of sized short fibers still present,
 introducing the desized and sieved short fibers into a reactor, and
 coating the short fibers in the reactor by chemical vapor deposition in a fluidized bed.

A sieving is carried out after desizing in order to reduce the presence, or even eliminate the agglomerates of fibers, before coating the short fibers in a fluidized bed. In this way, short fibers coated in a unitary and homogeneous manner are obtained. The short fibers thus coated can thus be used to form the discontinuous fibrous reinforcement of a composite material part. The invention is of particular interest for the production of composite material parts of small size or of complex geometry but is however not limited to these applications.

During sieving, the fibers can pass through a sieve having a plurality of holes having an average size less than or equal to 500 µm, for example less than or equal to 400 µm, for example less than or equal to 250 µm, for example less than or equal to 200 µm.

Such fine values for the holes of the sieve advantageously participate in further reducing the risk of the presence of agglomerates of fibers and in tightening the distribution of the length of the short fibers, thus further improving the unitary character and the homogeneity of the coating formed.

Unless otherwise stated, an "average" dimension designates the dimension given by the statistical granulometric distribution to half of the population, called $d_{50}$. In an exemplary embodiment, the sieving of the desized short fibers comprises passing these fibers through a first sieve having a plurality of first holes having a first average size in order to obtain first undersized grains, and passing the first undersized grains through a second sieve having a plurality of second holes having a second average size smaller than the first average size in order to obtain second undersized grains forming the desized and sieved short fiber.

Such a feature participates in further reducing the risk of the presence of agglomerates of fibers and thus further improving the unitary character and the homogeneity of the coating formed.

In particular, the first average size can be less than or equal to 500 µm and the second average size less than or equal to 200 µm.

In an exemplary embodiment, the short fibers are stirred during coating using a stirring member.

Such a feature participates in further reducing the risk of the presence of agglomerates of fibers and thus further improving the unitary character and the homogeneity of the coating formed.

In an exemplary embodiment, a vibration movement is imposed on said reactor during coating using a vibrating member.

Such a feature participates in further reducing the risk of the presence of agglomerates of fibers and thus further improving the unitary character and the homogeneity of the coating formed.

In an exemplary embodiment, the short fibers are made of silicon carbide. Of course, the short fibers can alternatively be formed from another material such as carbon, an oxide or a nitride.

In an exemplary embodiment, during coating, at least one layer of: pyrolytic carbon, boron nitride, boron nitride doped with silicon, silicon nitride or carbon doped with boron is deposited on the short fibers. This type of coating can in particular be combined with the use of silicon carbide fibers.

The invention also relates to a method for manufacturing a composite material part, comprising at least:
  implementing a method as described above in order to obtain coated short fibers,
  shaping the coated short fibers so as to form a porous preform of the part to be obtained, and
  forming a matrix in the porosity of the preform in order to obtain the composite material part.

In an exemplary embodiment, the matrix is formed by infiltrating a composition of molten silicon or of a molten silicon alloy into the pores of the preform.

The invention also relates to a method for manufacturing a composite material part, comprising at least:
  implementing a method as described above in order to obtain coated short fibers,
  mixing the short fibers coated with the matrix material or with a matrix precursor, and
  introducing the mixture thus obtained into a mold and heat treating the mixture introduced in order to obtain the composite material part.

In an exemplary embodiment, the matrix comprises at least one ceramic matrix phase, for example a silicon carbide matrix phase.

In an exemplary embodiment, the part can be a part of a turbomachine, for example a part of an aeronautical turbomachine or an industrial turbomachine.

BRIEF DESCRIPTION OF THE DRAWINGS

FIG. 1 schematically and partially illustrates a device for the implementation of a chemical vapor deposition in a fluidized bed usable in the context of the invention.

FIG. 2 shows schematically and partially the separation of short fibers by a stirring member in a method variant according to the invention.

FIG. 3 provides photographs obtained by scanning electron microscopy of short fibers which have been coated by implementing the invention.

DESCRIPTION OF EMBODIMENTS

The short fibers are initially desized by heat treatment. This heat treatment for removing the sizing can, for example, be carried out at a temperature greater than or equal to 700° C. under a flow of $N_2$ for a period ranging from 1 hour to 2 hours. The desizing can be done in a fluidized bed.

The short fibers thus desized are then sieved by passing through a sieve or several sieves the average size of the holes of which is decreasing. In the case where the fibers pass successively through two sieves respectively having holes of a first average size and of a second average size smaller than the first average size, the first average size can be comprised between 200 μm and 500 μm, for example between 350 μm and 450 μm or between 400 μm and 500 μm, and the second average size can be comprised between 100 μm and 200 μm, for example between 150 μm and 200 μm. The first average size can for example be substantially equal to 200 μm and the second average size substantially equal to 100 μm.

Once the fibers have been desized and sieved, they can be introduced into a reactor in order to carry out a chemical vapor deposition in a fluidized bed.

The structure of a device 1 useful for the implementation of a coating method according to the invention will be described in connection with FIG. 1. The chemical vapor deposition in a fluidized bed is a technique known per se.

The device 1 comprises a reactor 3 defined by a wall which can be made of quartz, Inconel® or alumina. The reactor 3 comprises an inlet 5 communicating with a gas source 6 through which the gas phase comprising the precursor of the coating to be formed is intended to be introduced into the reactor 3. The reactor 3 further comprises an outlet 7 communicating with a pumping system 8 in order to ensure the creation of a vacuum in the reactor 3. The device 1 comprises a heating system 9 capable of heating the interior of the reactor 3 in order to allow the formation of the coating from the precursor introduced by chemical vapor deposition. In order to stabilize the temperature of the reactor 3 during the coating, the reactor 3 can be provided at the inlet 5 with a thermal insulating element.

The short fibers 11 to be coated are present inside the reactor 3 (see FIG. 2).

The short fibers 11 can have an average length less than or equal to 1 mm, for example less than or equal to 500 μm. The average length of the short fibers can be comprised between 100 μm and 5 mm, for example between 100 μm and 1 mm, for example between 100 μm and 500 μm. The short fibers 11 can have an average diameter less than or equal to 20 μm, for example comprised between 5 μm and 20 μm, or even between 8 μm and 14 μm. The short fibers 11 can be obtained from long fibers by mechanical cutting or grinding.

The short fibers 11 are made of ceramic or carbon material. The short fibers can be made of carbide, nitride or oxide ceramic material. It is possible in particular to use short fibers 11 made of silicon carbide, having for example an oxygen content less than or equal to 1% in atomic percentage. Such short fibers 11 can be fibers of the Hi-Nicalon type S type marketed by the company NGS.

The short fibers to be coated can in particular constitute the only solid phase in the fluidized bed. It will be noted that the desizing treatment described above can be carried out in the reactor 3 then the desized short fibers can be removed from this reactor 3 to be sieved then reintroduced into the reactor 3 in order to carry out the coating in a fluidized bed.

In FIG. 2, the dimensions of the short fibers 11 have been exaggerated for reasons of readability.

FIG. 2 illustrates the case where the mixture of short fibers 11 is stirred during coating in order to further reduce the risk of obtaining parasitic aggregates. This figure illustrates the phenomenon of fluidization of the bed comprising the short fibers 11 in which each short fiber 11 is separated from the others and "bathes" in the mixture of gas precursor introduced into the reactor 3. The device comprises a stirring member comprising an element 30 rotatable about its axis and carrying one or more stirring members 32, for example one or more stirring blades 32. The axis of rotation of the rotary member 30 may be collinear with the height of the reactor 3. The stirring members 32 are positioned in the bed formed by the short fibers 11. The movement of the stirring members 32 (rotation shown schematically by the arrow R in FIG. 3) allows to break the agglomerates of fibers. It is possible, according to a variant not illustrated, to position upstream of the zone of the bed to be fluidized, an element for disturbing the flow of the gas phase. In this variant, it is the turbulence induced in the carrier gas which serves to reduce the risk of appearance of parasitic aggregates. Of course, these different techniques for reducing the risk of appearance of parasitic aggregates can be combined.

In the example of device 1 considered in FIG. 1, it is also possible to vibrate the reactor 3 during the coating in order to further reduce the risk of obtaining parasitic aggregates. This vibration is ensured by a vibrating member comprising one or more vibration motors 20 and a vibrating support 21 intended to be vibrated by the motors 20 and to communicate this vibration to the reactor 3. The vibrating support 21 can be in the form of a tray but it does not depart from the scope of the invention when it has a different shape. The frequency of the vibration movement imposed on the reactor 3 can be comprised between 10 Hz and 70 Hz, preferably between 20 Hz and 50 Hz. In the example illustrated, the vibration movement imposed on the reactor 3 is a rectilinear movement along the height of the reactor 3. However, the scope of the invention is not departed from if the direction of the vibration movement is modified, by imposing for example a vibration along the diameter of the reactor or else a non-rectilinear vibration, for example curvilinear or even circular. The fact of imposing a rectilinear vibration movement on the reactor 3 is however preferential.

The gas phase introduced into the reactor 3 for producing the coating depends on the nature of the coating to be obtained and it is within the general knowledge of the person skilled in the art to choose it and to choose the associated deposition conditions, in terms of temperature, pressure and flowrate. The gas phase typically comprises an inert, carrier gas, such as nitrogen. It is possible to use gas precursors under standard conditions, in which case they can be mixed with the carrier gas before being introduced into the reactor 3. It is also possible to use liquid precursors under standard conditions, in which case the carrier gas can bubble in the liquid precursor to be enriched therefrom then be introduced into the reactor 3. It is also possible to use a Direct Liquid Injection ("DLI") system.

In the non-limiting example of depositing a pyrocarbon coating, dinitrogen can be used as the carrier gas. The rate of introduction of the carrier gas into a reactor 3 with a diameter of 5 cm and a height of 1 m can be comprised between 500 standard cubic centimeters per minute and 3000 standard cubic centimeters per minute, for example between 750 standard cubic centimeters per minute and 1250 standard cubic centimeters per minute. The temperature imposed inside the reactor 3 can be comprised between 850° C. and 1100° C., for example between 925° C. and 1000° C. It is possible to use, in this non-limiting case, methane as precursor of the pyrocarbon to be deposited. Its flowrate is comprised between 5% and 30% of the carrier gas flowrate, for example between 10% and 20% of the carrier gas flowrate. By way of example, mention may be made of other precursors for the pyrocarbon, such as gas precursors such as propane, methane/propane mixtures or natural gas. Mention may also be made of liquid precursors such as toluene, cyclohexane or ethanol.

The person skilled in the art will take care, during the implementation of the invention, to obtain a phenomenon of fluidization during coating, as is usually achieved in chemical vapor deposition methods in a fluidized bed. To enable fluidization to be monitored, the device 1 comprises a differential pressure sensor 4, enabling the pressure drop of the gas to be evaluated as it passes through the bed. The person skilled in the art can advantageously maintain this pressure drop at a value close (+/−20%) to the ratio between the weight of the bed and the section of the reactor 3 in order to guarantee the state of fluidization. The person skilled in the art can also take care to have a relative temperature homogeneity inside the bed. This thermal property, characteristic of optimally operating fluidized beds, is obtained by the presence of bubbles which ensure excellent agitation of the short fibers. Heat transfers within the bed are thus greatly promoted. Thermocouples 17 located inside a sheath 15 centered at the reactor 3 are disposed at different positions of the fluidized bed and allow to control the isothermality of the bed. The quality of the fluidization can therefore be evaluated from the maximum deviation of the temperatures displayed by the thermocouples. For example, the person skilled in the art will be able to carry out the deposition with a maximum temperature difference of less than or equal to 20° C., for depositions at high temperature (greater than 800° C.).

The coating deposited may include at least one layer of pyrolytic carbon (PyC), boron nitride (BN), boron nitride doped with silicon (BN(Si), with silicon in a mass proportion comprised between 5% and 40%, the balance being boron nitride), silicon nitride $Si_3N_4$ or boron-doped carbon (BC, with boron in an atomic proportion comprised between 5% and 20%, the balance being carbon). The coating deposited may be an interphase having a function of weakening the composite material which promotes the deflection of any cracks reaching the interphase after having propagated in the matrix, preventing or delaying the rupture of the reinforcement by such cracks. The coating deposited on the short fibers 11 can be a monolayer coating. Alternatively, the coating deposited on the short fibers 11 can be a multilayer coating. In this case, the nature of the precursor can be changed between the deposition of the different layers in order to deposit layers of different chemical nature. After the deposition of the first layer, the temperature of the reactor is lowered, the residual gas reactants are evacuated, then the temperature is raised and the reactants for producing the second layer are injected into the reactor. It is for example possible to deposit a first layer of an interphase material and a second layer of a different and refractory material intended to protect the fibers during the formation of the matrix. Such a protective material can for example be made of silicon carbide. It is for example possible to make a first deposition of boron nitride or of pyrocarbon then a second deposition of silicon carbide on the first deposition. It is advantageous to deposit pyrolytic carbon on the short fibers in order to facilitate the circulation of the coated fibers relative to each other when handled, which participates in further reducing the risk of forming parasitic aggregates.

Once the coating has been performed, the coated short fibers are recovered to be used as discontinuous fibrous reinforcement of a composite material.

Photographs obtained by scanning electron microscopy of short fibers which have been coated by implementing the invention are provided in FIG. 3. In this example, a carbon interphase material with a thickness of around 600 nm was deposited on short Hi-Nicalon-S fibers with a diameter of around 12 μm, and a length comprised between 50 μm and 200 μm.

A mixture comprising a binder and the coated short fibers can be prepared. The binder can for example comprise a polymer, such as a thermoplastic or thermosetting resin, or a plasticizer. It may be advantageous to heat the mixture in order to thin the binder to facilitate mixing and allow better homogenization. A preform of the part to be manufactured is then formed by shaping the prepared mixture, for example by injecting the mixture into the cavity of a mold. The binder present in the preform is then removed in order to obtain a debinded preform. The binder can be removed in a manner known per se, for example by pyrolysis in the case of a thermosetting resin so as to leave a consolidating phase which improves the shape retention of the fiber preform. The fibrous preform is not woven. The fibrous preform is porous and its porosity is intended to be filled with a matrix. The matrix is then formed. The matrix coats the short fibers. The matrix can be formed by infiltration in the molten state of the pores of the porous preform by a molten composition comprising molten silicon, in order to obtain the part. The molten composition may consist of pure molten silicon or alternatively be in the form of a molten alloy of silicon and one or more other constituents. A part made of CMC material is then obtained. Alternatively, another type of matrix, such as an organic or carbon matrix, can be formed. Various techniques for forming the matrix can be considered, such as chemical vapor infiltration or methods of infiltration and pyrolysis of matrix precursors in the liquid state. The part can then be obtained by heat treatment of the mixture introduced into the mold, for example in order to crosslink the matrix material or pyrolyze the precursor. Mechanical stress may or may not be applied during heat treatment to further densify the composite. It is also possible to form the matrix by hot pressing a mixture comprising the coated short fibers and a powder intended to form the matrix with or without a binder.

The part obtained can be a part of a turbomachine, for example of an aeronautical turbomachine or an industrial turbomachine. The part obtained can be a turbine part. The part obtained can be a turbomachine blade, for example a turbine blade. The part obtained can alternatively be a sector of a turbine ring.

The expression "comprised between . . . and . . . " must be understood as including the limits.

The invention claimed is:

1. A method for coating fibers, comprising:
    desizing sized short fibers by removing a sizing present on the short fibers, the short fibers having an average length less than or equal to 5 mm, the short fibers being made of ceramic material or carbon,
    sieving the desized short fibers in order to separate them from any agglomerates of sized short fibers still present,
    introducing the desized and sieved short fibers into a reactor, and
    coating the short fibers in the reactor by chemical vapor deposition in a fluidized bed.

2. The method according to claim 1, wherein sieving the desized short fibers comprises passing the fibers through a first sieve having a plurality of first holes having a first average size in order to obtain first undersized grains, and passing the first undersized grains through a second sieve having a plurality of second holes having a second average size smaller than the first average size in order to obtain second undersized grains forming the desized and sieved short fibers.

3. The method according to claim 2, the first average size is less than or equal to 500 µm and the second average size less than or equal to 200 µm.

4. The method according to claim 1, wherein the short fibers are stirred during coating using a stirring member.

5. The method according to claim 1, wherein a vibration movement is imposed on said reactor during coating using a vibrating member.

6. The method according to claim 1, wherein, during coating, at least one layer of: pyrolytic carbon, boron nitride, boron nitride doped with silicon, silicon nitride or carbon doped with boron is deposited on the short fibers.

7. The method for manufacturing a composite material part, comprising:
    implementing a method according to claim 1 in order to obtain coated short fibers,
    shaping the coated short fibers so as to form a porous preform of the part to be obtained, and
    forming a matrix in the porosity of the preform in order to obtain the composite material part.

8. The method according to claim 7, wherein the matrix is formed by infiltrating a composition of molten silicon or of a molten silicon alloy into pores of the preform.

9. The method for manufacturing a composite material part, comprising:
    implementing a method according to claim 1 in order to obtain coated short fibers,
    mixing the short fibers coated with the matrix material or with a matrix precursor, and
    introducing the mixture thus obtained into a mold and heat treating the mixture introduced in order to obtain the composite material part.

* * * * *